United States Patent [19]

Kerner et al.

[11] 4,192,010

[45] Mar. 4, 1980

[54] DATA REDUCTION SYSTEM

[76] Inventors: William R. Kerner, 16186 Rimrock Rd.; Jarred Morton, 19095 Corwin Rd., both of Apple Valley, Calif. 92307

[21] Appl. No.: 855,484

[22] Filed: Nov. 28, 1977

[51] Int. Cl.² .............................................. G06F 7/22
[52] U.S. Cl. ............................ 364/900; 340/347 DD
[58] Field of Search ............ 340/347 DD, 146.3 WD; 364/200 MS File, 900 MS File

[56] References Cited

U.S. PATENT DOCUMENTS

| | | | |
|---|---|---|---|
| 3,413,611 | 11/1968 | Pfuetze | 364/900 |
| 3,613,087 | 6/1975 | Brown | 340/172.5 |
| 3,976,844 | 8/1976 | Betz | 340/172.5 |
| 4,034,350 | 7/1977 | Kashio | 364/900 |

*Primary Examiner*—Gareth D. Shaw
*Assistant Examiner*—C. T. Bartz
*Attorney, Agent, or Firm*—Nilsson, Robbins, Dalgarn, Berliner, Carson & Wurst

[57] ABSTRACT

A data reduction apparatus and method are disclosed in which a serial bit stream, as for example representing characters of a message, can be formatted, registered, transmitted and reconstructed using a number of representative bits reduced from an original conventionally-coded stream to conserve space, transmission time, or bandwidth. More specifically, the original bit stream is treated in segments or data blocks, each consisting of a predetermined number of characters which are defined by a predetermined number of bits. The characters in each data block are arranged or ordered in a pattern for sequential processing in separate sets, according to their frequency of occurrence within the data block. The specific characters used in a block are specified. The positional information of the ordered sets of characters is coded followed by reduced-bit or abbreviated codes that specify the characters of each select group or set. Advantage is taken of developed data to further reduce the need for data bits, as timely termination of the representative format. In this manner, the number of bits developed to carry specific information can be substantially reduced.

9 Claims, 12 Drawing Figures

| | W | H | E | N | , | A | F | T | E | R | | A |
|---|---|---|---|---|---|---|---|---|---|---|---|---|
| | R | E | I | G | N | | O | F | | T | W | E | N |
| T | Y | - | F | O | U | R | | Y | E | A | R | S | , |
| | E | D | W | A | R | D | | T | H | E | | C | O |
| N | F | E | S | S | O | R | | D | I | E | D | | C |
| H | I | L | D | L | E | S | S | , | | E | N | G | L |
| A | N | D | | W | A | S | | A | G | A | I | N | |
| F | A | C | E | D | | W | I | T | H | | T | H | E |
| | C | H | O | I | C | E | | O | F | | A | | S |
| U | C | C | E | S | S | O | R | . | | A | N | D | |
| T | H | E | R | E | | W | A | S | | N | O | T | |
| M | U | C | H | | D | O | U | B | T | | A | B | O |
| U | T | | W | H | E | R | E | | T | H | E | | C |
| H | O | I | C | E | | W | O | U | L | D | | F | A |

FIG. 8

| | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| 1 | 1 | 1 | 0 | 0 | 1 | 0 | 0 | 1 | 0 | 0 | 1 | 0 | 1 | 1 |
| 2 | 1 | 0 | 1 | 0 | 0 | 0 | 1 | 1 | 0 | 1 | 0 | 0 | 1 | 0 |
| 3 | 0 | 0 | 0 | 0 | 1 | 0 | 0 | 1 | 0 | 1 | 1 | 0 | 0 | 0 |
| 4 | 1 | 1 | 0 | 0 | 1 | 0 | 0 | 1 | 0 | 0 | 1 | 1 | 1 | 0 |
| 5 | 0 | 0 | 1 | 0 | 0 | 1 | 0 | 1 | 0 | 0 | 1 | 0 | 1 | 0 |
| 6 | 0 | 0 | 0 | 0 | 0 | 1 | 0 | 0 | 0 | 1 | 1 | 0 | 0 | 0 |
| 7 | 1 | 0 | 0 | 1 | 0 | 1 | 0 | 1 | 1 | 0 | 1 | 0 | 0 | 1 |
| 8 | 0 | 1 | 0 | 1 | 0 | 1 | 0 | 0 | 0 | 0 | 1 | 0 | 0 | 0 |
| 9 | 1 | 0 | 0 | 1 | 0 | 0 | 1 | 1 | 1 | 0 | 1 | 1 | 1 | 0 |
| 10 | 0 | 0 | 0 | 0 | 1 | 0 | 0 | 1 | 0 | 1 | 0 | 1 | 0 | 0 |
| 11 | 0 | 0 | 1 | 0 | 1 | 0 | 0 | 1 | 0 | 1 | 0 | 1 | 0 | 1 |
| 12 | 0 | 0 | 0 | 0 | 1 | 0 | 1 | 0 | 0 | 0 | 1 | 1 | 0 | 1 |
| 13 | 0 | 0 | 1 | 0 | 0 | 1 | 0 | 1 | 0 | 0 | 1 | 1 | 1 | 0 |
| 14 | 0 | 1 | 0 | 0 | 1 | 1 | 0 | 1 | 0 | 0 | 0 | 1 | 0 | 1 |

FIG. 6

| | | |
|---|---|---|
| SPACE | 34 | 1 |
| A | 14 | 1 |
| B | 2 | 1 |
| C | 10 | 1 |
| D | 10 | 1 |
| E | 21 | 1 |
| F | 7 | 1 |
| G | 3 | 1 |
| H | 11 | 1 |
| I | 7 | 1 |
| J | 0 | 0 |
| K | 0 | 0 |
| L | 4 | 1 |
| M | 1 | 1 |
| N | 9 | 1 |
| O | 12 | 1 |
| P | 0 | 0 |
| Q | 0 | 0 |
| R | 9 | 1 |
| S | 10 | 1 |
| T | 11 | 1 |
| U | 6 | 1 |
| V | 0 | 0 |
| W | 8 | 1 |
| X | 0 | 0 |
| Y | 2 | 1 |
| Z | 0 | 0 |
| (.) | 1 | 1 |
| (,) | 3 | 1 |
| (-) | 1 | 1 |

| SPACE | 34 | | |
|---|---|---|---|
| E | 21 | | FRAME 1 |
| A | 14 | | |
| O | 12 | | |
| H | 11 | | |
| T | 11 | | FRAME 2 |
| C | 10 | | |
| D | 10 | | |
| S | 10 | | |
| N | 9 | | FRAME 3 |
| R | 9 | | |
| W | 8 | | |
| F | 7 | | |
| I | 7 | | FRAME 4 |
| U | 6 | | |
| L | 4 | | |
| B | 2 | | |
| G | 3 | | |
| M | 1 | | SUPER-FRAME |
| Y | 2 | | |
| (.) | 1 | | |
| (,) | 3 | | |
| (-) | 1 | | |

FIG. 9

| SPACE | 00 |
|---|---|
| E | 01 |
| A | 10 |
| O | 11 |

| B | 000 |
|---|---|
| G | 001 |
| M | 010 |
| Y | 011 |
| (.) | 100 |
| (,) | 101 |
| (-) | 110 |

DATA REDUCTION SYSTEM

FIELD OF THE INVENTION

The invention relates to information processing and more particularly to systems in which digital information is represented by a reduced number of bits in relation to conventional systems of the prior art.

BACKGROUND AND SUMMARY OF THE INVENTION

The need for data reduction, e.g. to represent digital data by using fewer bits, has become a recognized objective in several fields, e.g., communication and data storage. Considering a specific example, conventional teletype systems operate utilizing binary signals to represent seven-bit codes, each seven-bit code group identifying one of 128 possible characters. In using such a code, conventional representation of a message requires a number of bits equal to the number of characters (in the message) multiplied by seven. For example, the representation of a 196 character message would require 1,372 bits.

The invention disclosed herein provides both a method and an apparatus for shortening such conventional message formats. However, the system of the present invention is applicable generally for the registration or transmission of various digitized messages such as may occur in teletype, television, telephony, telemetry, and so on.

In the system of the present invention, reducing the transmitted or stored binary data is accomplished by formatting or dividing a message into data blocks or sequences of characters (alpha-numeric, for example), each of which contains a predetermined number of binary-coded characters. The block is then analyzed by a dissection philosophy that involves priority treatment of characters. Advantage is taken of the fact that most intelligence-bearing messages have some degree of coherency (certain elements or characters of the message are repeated within the data block more often than others). That is, a coherent data block normally includes several characters that are variously repeated while some characters may not be present at all. By identifying the characters used in a data block, treating them in limited sets, e.g. four characters, and assigning abbreviated codes while specifying their locations in the data block, the representative binary format may be reduced. Other aspects will become apparent as treated below in detail.

BRIEF DESCRIPTION OF THE DRAWINGS

The invention may best be understood when considered in light of the following detailed description taken in conjunction with the accompanying drawings, wherein.

DETAILED DESCRIPTION

As required, detailed illustrative embodiments of the invention are disclosed herein. These embodiments exemplify the invention and are currently considered to be the best embodiments for such purposes. However, it is to be recognized that many different data block sizes, digital identifier codes, binary-coding formats, frame sizes and character lengths can be utilized. Accordingly, the specific formats disclosed are representative only in providing a basis for the claims which define the scope of the present invention.

In general, the system of the present invention may be variously implemented to process a variety of data, as for transmission or registration. As treated in the illustrative systems herein, binary representation is employed and the message, comprising binary coded characters, is divided into data blocks, each including a predetermined number of character positions, as to accommodate a predetermined number of characters. The characters of the data block are ordered according to the extent of their presence in the data block. The formatting treats the ordered characters in small groups or sets, the signal format for which is termed a "frame". Specifically, for example, the first frame treats the four most-popular characters in the data block. The first frame data format includes a binary representation designating all the locations in the block occupied by any of the first-frame characters, i.e. the first frame character locations. Additionally, abbreviated binary codes are assigned to the frame characters and are provided in a sequence, related to the character location data. The process is repetitive on a frame-by-frame basis, recognizing the reduction resulting from previously treated data.

As a simplified example, consider now the conversion or development of an illustrative message in the form of a sequence of numerals, 2473 . . . 462440, each of which could be represented by a conventional three-bit binary code group. Also, assume that the message is exactly one data block in length in that it consists precisely of a predetermined number of characters. From the message, it is apparent that some of the numerals are repeated while other numerals (1 and 5) do not appear.

Specifically, the numeral "4" appears four times, while the numeral "5" does not appear. That information is an element of the operating format of the system disclosed herein. The message is arranged or ordered so that the numerals present in the greatest number are identified and treated first with other numerals following in the order of their presence, ties being ordered in accordance with smaller numerals first. In such an order, the numerals are treated in small groups or sets (in frame formats) with the result that abbreviated codes can be used.

Considering the example in somewhat further detail, the four most-repeated numerals, i.e. 4, 2, 0, and 3, will be treated as the first set or the first frame. For each frame, a character location format is developed to indicate the presence of any one of the four characters in the data block. Specifically, with asterisks (*) indicating the numerals of the first frame, the binary format for the character locations of the first frame would be:

| message (data block) | 2* | 4* | 7 | 3* | ..... | 4* | 6 | 2* | 4* | 4* | 0* |
|---|---|---|---|---|---|---|---|---|---|---|---|
| presence code (character location) | 1 | 1 | 0 | 1 | ..... | 1 | 0 | 1 | 1 | 1 | 1 |

Following the presence or character locations code, the next first frame component in the compacted format would have abbreviated codes representative of the four numerals of the frame, which codes are pre-assigned based on the sequential order of the list of characters used. For example, based upon the extent of presence (popularity), the numerals of the first set may be represented by abbreviated (two-bit) codes as follows:

| Numeral (Frame 1) | Code (Digital Identifier) |
|---|---|
| 4 | 00 |
| 2 | 01 |
| 0 | 10 |
| 3 | 11 |

Thus, more specifically, the frame format includes a first component which collectively specifies the locations in the message sequence (data block here) of all the characters of the frame; a second component then takes the form of abbreviated codes for the characters to indicate their sequence of occurrence.

| first-frame characters | 4 | 2 | 0 | 3 | | | | | | |
|---|---|---|---|---|---|---|---|---|---|---|
| message | 2 | 4 | 7 | 3...4 | | 6 2 | 4 | 4 | 0 | |
| locations occupied by first-frame characters | 1 | 1 | 0 | 1...1 | | 0 1 | 1 | 1 | 1 | |
| abbreviated codes for first-frame characters | 01 | 00 | | 11 | 00 | 01 | 00 | 00 | 10 | |

The frame format thus specifies the locations occupied by the frame characters, and the abbreviated codes designate the frame character in each identified character location; spaces indicated in the latter between codes are closed. After each frame, the character locations in the data block are reduced by eliminating the treated or used character locations. Thus, (except for some terminating techniques that may be used) the operation is repetitive until all the numerals in the data block have been treated. Of course, in a typical operating situation, the message would likely consist of more characters (alpha-numeric), greater variation, and accordingly encompass a plurality of data blocks.

Figure 1:
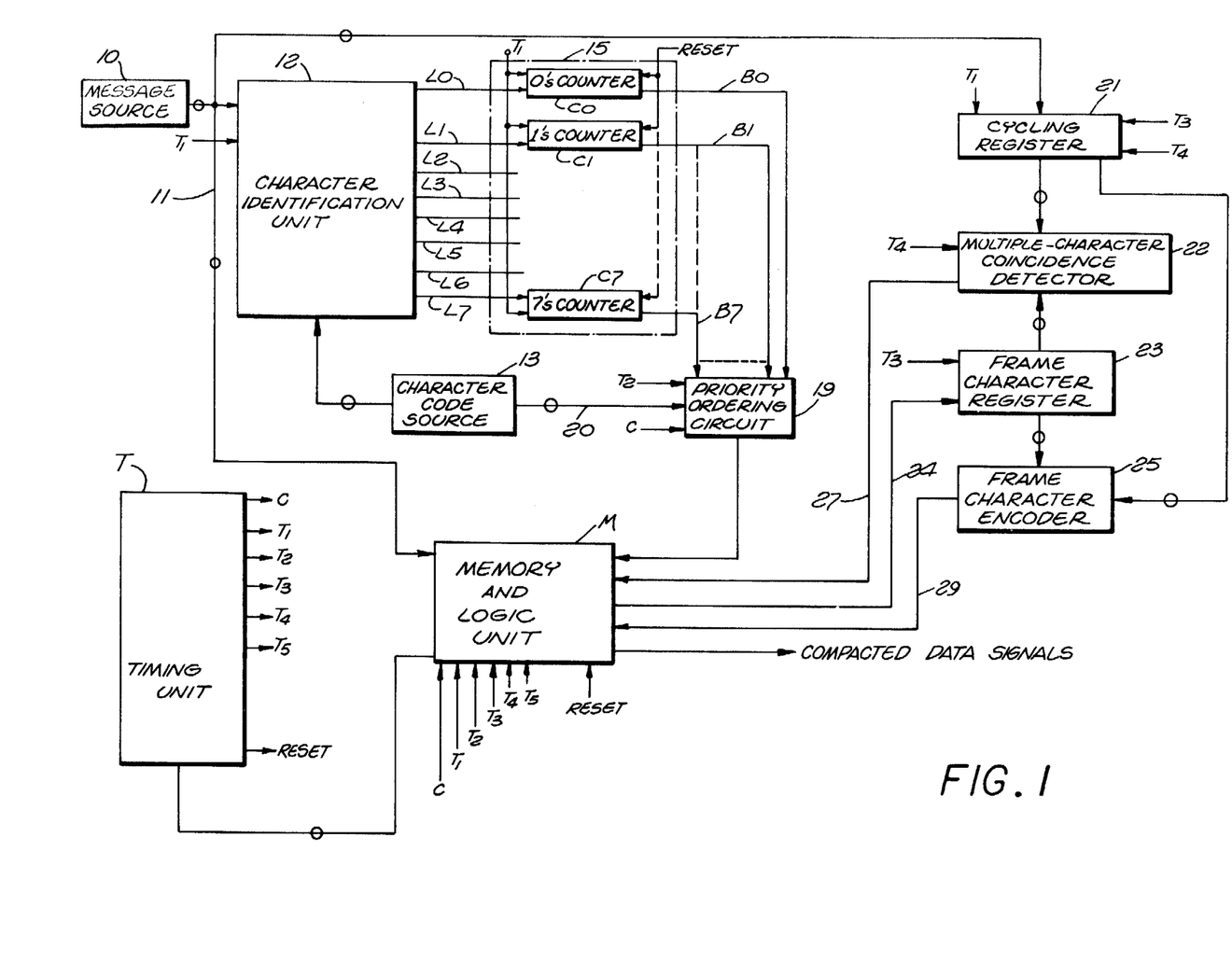
FIG. 1 is a block diagram showing an illustrative encoding embodiment of the invention.

Continuing with the above-described example, reference will now be made to FIG. 1 in which component parts interact to develop signals representative of the compacted format. In that regard, the system operates in time sequences defined by a timing unit T (lower left). Specific intervals of time are defined by singularly high levels of binary signals T1, T2, T3, T4, and T5. The timing intervals so defined, along with clock signals C from the unit T sequence the operation of the system to develop and register the compacted format of the assumed message in a memory M (with some control logic—lower central). More specifically, binary bits are developed and registered to represent the single-block message in a format: (1) an ordered index of characters utilized in the message; (2) a binary group indicating first-frame character locations; (3) first-frame abbreviated character designations; and so on for repeating-frame sequences.

Pursuing the example, assume the message (2473 ... 462440) is provided in the form of binary signals from a message source 10 (upper left) to a branched communication channel 11 that is coupled to a character identification unit 12 and to the memory unit M along with a cycling register 21 (upper right) in which the message circulates for availability during the development of signals for each frame. From the message source 10, the signal-represented characters of the message are manifest conventionally as binary code pulses, e.g "2" and "4" are represented as 010 and 100, respectively.

During the interval of the timing signal T1, the representative binary signals are accepted and registered in the memory M and the cycling register 21. Concurrently, these signals are processed by the identification unit 12 which may comprise a decoding matrix, essentially for indicating the presence of different characters by applying pulses to different lines L0—L7. That is, the unit 12 identifies signals representing each of the characters in the message as by detecting coincidence with standards from a signal-coded character source 13. Thus, each binary-coded character from the message source 10 is decoded to provide a pulse on an associated one of the lines L0 through L7 which are connected individually to a group of counters C0 through C7 (not all shown) in a character count register 15. Consequently, at the end of the message, timing signal T1 yields to timing signal T2 and the presence or number of appearances for each of the possible characters (0-7) is registered in the count register 15.

In the operation of the system during the interval of the timing signal T2, a priority ordering circuit 19 gates those binary coded signals present in the message from the source 13 to the memory unit M in the order of their popularity. Considering the operation somewhat more specifically, at the conclusion of the first timing interval T1, the counter C0 registers a count of "1". The contents of the other counters C1 through C7 would be as indicated below:

| Character (numeral) | Frequence of Occurrence | (Indicated by Counter) |
|---|---|---|
| 0 | 1 | C0 |
| 1 | 0 | C1 |
| 2 | 2 | C2 |
| 3 | 1 | C3 |
| 4 | 4 | C4 |

-continued

| Character (numeral) | Frequence of Occurrence | (Indicated by Counter) |
|---|---|---|
| 5 | 0 | C5 |
| 6 | 1 | C6 |
| 7 | 1 | C7 |

Signals representative of the contents of each of the counters C0 through C7 are provided through one of a set of associated cables B0 through B7 (not all shown) respectively to a priority ordering circuit 19, which is operative during the period of timing signal T2 and may take the form of a multiplexor apparatus. The priority ordering circuit 19 also receives binary representations of each of the characters through a cable 20 from the character code source 13. The binary signal representations (characters) are gated by the priority ordering circuit 19 in an order determined by the contents of the counters C0 through C7. Specifically, as the character "4" is most popular (four occurrences) the binary coded signals for that character ("4") are gated from the character code source 13 through the priority ordering circuit 19 to the memory M. In that manner, the first character ("4") in the priority list is registered to be treated as the first character of the first frame.

In sequence, during the interval of the timing signal T2, the priority ordering circuit 19 gates the signal representations for each of the characters present in the data block to the memory M in their order of popularity. In the event that two (or more) characters are present in the message to the same extent, then the less significant characters will precede the more significant characters in the ordered arrangement. Thus, for the above message (2473 . . . 462440) (to the extent treated illustratively) the priority ordering circuit 19 will provide signal representations of the characters in the order: 4, 2, 0, 3, 6, 7.

Note that, as there is neither a "1" nor a "5" appearing in the message (to the extent treated) these characters are ignored. Note also that the representative sequential signals (which manifest characters) use binary representation: i.e. 100, 010, 000, 011, 110, and 111. These signals are also counted in an assigned location of the memory M. Consequently, in the specific example, a count of "6" would be registered as the number of characters utilized in the data block. Thus, the first elements of the compacted format are developed, specifically, the number of characters in the index of characters utilized ("6") and the list or index of the characters utilized (4, 2, 0, 3, 6, 7). By specifying the number of characters utilized, the signals actually representing those characters can be recognized.

The explanation will now proceed to the operation of formatting the individual frames of the compacted format. In addition to the operations described above, during the interval of timing signal T1, the original message is received in a cycling register 21 (upper right) which functions to sequentially present the characters of the message upon each occurrence of the timing signal T4. In that regard, the interval of the timing signal T3 is preparatory and the timing signals T3 and T4 repeat in a cycle until all the frames of the compacted format have been treated. During the period of the signal T3, the set of characters of the current frame are selected, then during the signal T4, signals are developed to represent the locations of the frame characters and the abbreviated character codes, both as binary sequences.

Initially considering the development of the binary signals indicative of the locations in the block format of the first-frame characters, signals representative of those characters (4, 2, 0, 3) are registered through a cable 24 in a frame character register 23, during the timing signal T3. Thereafter, during the timing signal T4, the message is provided from the cycling register 21 to a multiple-character coincidence detector 22 which also receives character-representing signals from the frame character register 23. Thus, in each instance when one of the characters of the fist set (first frame) occurs, in the message sequence, a coincidence is detected by the detector 22 and a pulse is gated through a conductor 27 to be registered in the memory unit M. The absence of a coincidence results in no pulse, so that a "zero" is registered for the character location. Thus, the location-used sequence is developed for the first frame. Concurrently, during the timing signal T4, the characters of the first frame are encoded, using the abbreviated codes.

The second component of the frame comprises the abbreviated character signals which are provided from a frame character encoder 25. Signals representative of the characters of the first frame are supplied from the register 23 ordered by popularity. Predetermined codes are applied based upon the popularity order so that upon the occurrence of a first-frame character applied to the encoder 25 from the register 21, an abbreviated code is gated to the memory unit M through a conductor 29. Note that the spaces that occur between characters of the frame are closed.

Prior to relating the above structure to the exemplary message, a summary of the operations in general may merit review. Specifically:

| Interval | Operation |
|---|---|
| T1 | Set contents of C0–C7 to indicate characters present and popularity of each. Register message in cycling register 21 and memory unit M. |
| T2 | Register ordered character signals into memory unit M. |
| T3 | Register frame character signals (4 characters) in frame character register 23). |
| T4 | Compare characters of frame from register 23 with characters of message from cycling register 21 and register coincidences (1) or lack of thereof (0) in the memory unit M and encode characters of frame in two digit code, for registration in the memory unit M. Return to T3 until all message characters are treated. |
| T5 | Standby to provide compacted message. |

The development and registration of the ordered index of characters: 4, 2, 0, 3, 6, 7 in the memory unit M during the timing signals T1 and T2 was treated above. From that data, signals representative of the characters 4, 2, 0, and 3 (most popular) for treatment in the first frame are provided from the memory M during the interval of T3 and registered in the register 23. Thereafter, during the interval of the signal T4, the cycling register provides the message characters as binary signal representations for sequential comparison with the set of characters for the first frame (4, 2, 0, and 3). Upon each coincidence, the coincidence detector 22 provides a pulse ("one") which is registered in the memory M.

Thus, the signals for the first frame character locations are developed in the memory M (1101 ... 101111).

As indicated above, the frame characters are also encoded (abbreviated) during the timing signal T4 although the results of these operations are presented sequentially rather than simultaneously in the compacted data format. The message characters from the cycling register 21 are checked in sequence by the encoder 25 and upon each occurrence of one of the frame characters (4, 2, 0, or 3) it is encoded in the two-bit format indicated above to provide the representative binary signals to the memory unit M through the conductor 29. Specifically, in the message sequence the numerals 2, 4, 7, 3 etc. would be encoded as 01, 00,—11 etc. The character "7" not being a frame character is skipped and no space is reserved. Thus, the two components of the frame are developed and registered in the memory unit M.

After the first frame format is completed, development of the next frame format is initiated by the timing unit providing the timing signal T3 in a high state to transfer the second frame characters. The second frame is then developed during a re-occurrence of the signal T4. In that manner, the system is repetitive until the message is completed, after which the timing unit provides the signal T5 in a high state indicating the system is ready to formulate a sequence of binary signals representative of the compacted format.

Figure 2:
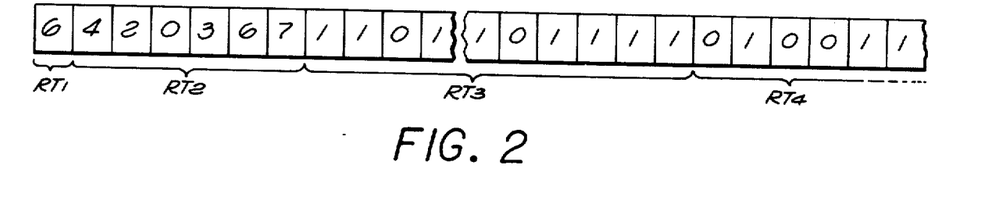
FIG. 2 is a graphic representation of an encoded message.

A somewhat abbreviated representation of the compacted data format is illustrated in FIG. 2 and will now be considered with respect to timing intervals RT1-RT4 that are developed in the course of reconstructing the original data block from the compacted format.

It is to be understood that the compacted format comprises a sequence of binary digits, i.e. bits; however, in FIG. 2, for simplification of explanation, decimal characters (numerals) are represented with the understanding that the actual signal represented format would be binary coded decimal.

The sequence of FIG. 2 continues with the simplified exemplary message treated in detail above and the initial representation is of the number "6" (timing interval RT1) to indicate that six different characters are used in the message. Next, an index of all the characters of the message are manifest, specifically indicating the numerals 4, 2, 0, 3, 6, and 7 (timing interval RT2); appearances being in a descending order of popularity as explained in detail above. It is noteworthy that the initial data (indicating the number "6") indicates the termination location of the index of characters used.

The sequence next treats the characters in sets of four, in individual frame formats. As explained above, each frame includes: a first component indicating the positions occupied by the characters of the first frame and a second component indicating the characters in sequence with an abbreviated code. Specifically, in the initial component of the frame, one binary digit space is provided for each character location in the data block, the digits being arranged in the sequence of scanning the character locations of the data block. In the event that a character location of the data block carries one of the four characters (four most significant) of the message, the digit will be a "one"; otherwise, a "zero" is manifest.

The component (RT3) (indicating the character locations used by characters of the frame) coincides in bit length to the number of characters in the data block. Upon its termination, the second component of the frame follows providing the abbreviated codes to identify the individual characters in the frame which are associated with the identified character locations (RT4). Specifically, as there are only four characters in the set, a conventional two-digit binary code represents the characters in their listed order, specifically: 00, 01, 10, and 11. These codes are indicated to coincide with "ones" in the character-location sequence previously provided.

Recapitulating, in the message (2473 ... 462440), the four most popular characters are: 4, 2, 0, 3. Consequently, these characters are established to be represented by the following abbreviated binary codes:

4=00
2=01
0=10
3=11

With continuing reference to FIG. 2, the first character in the message happens to be a character of the set treated in the first frame, i.e. "2", and is represented by the binary code 01. Following that representation, the binary code 00 represents the character "4", as the second character present in the message. The third character "7" is not treated in the first frame as indicated by the presence of a "zero" in the third character of the character-location sequence (RT3). However, the character "3" is the next character of the message and is treated in the first frame; accordingly, the pre-assigned binary code 11 is developed as illustrated.

Thus, the sequence of bits is provided in signal-represented form indicating the characters of the first frame. That sequence is followed by a similar format of signals from the memory M (FIG. 1) designating the characters of the second frame, and so on.

In reconstructing the compacted message or data, the represented binary sequence as depicted in FIG. 2 is treated in an order from left to right. The sequence is processed to reconstruct the original message by timing signals RT1-RT4 that relate to FIG. 2 to accommodate the illustrated sections as similarly identified.

It is to be appreciated that the system of the present invention may be variously utilized in connection with a variety of different structures having primary applications in data processing and communications. The compacted data may be simply registered for subsequent retrieval and reconstruction to a conventional format. Such operation may involve the memory M for registration or the data may be sequenced to provide a bit stream as described above for registration. Additionally, the bit stream may be sent over a communication link for handling or reconstruction at a remote location. Consequently, a composite system might involve various communication links, e.g. radio, telephone, and so on at the terminus of such equipment, or variously in other applications the bit stream may be reconstructed by a subsystem as will now be explained with reference to FIG. 3.

Figure 3:
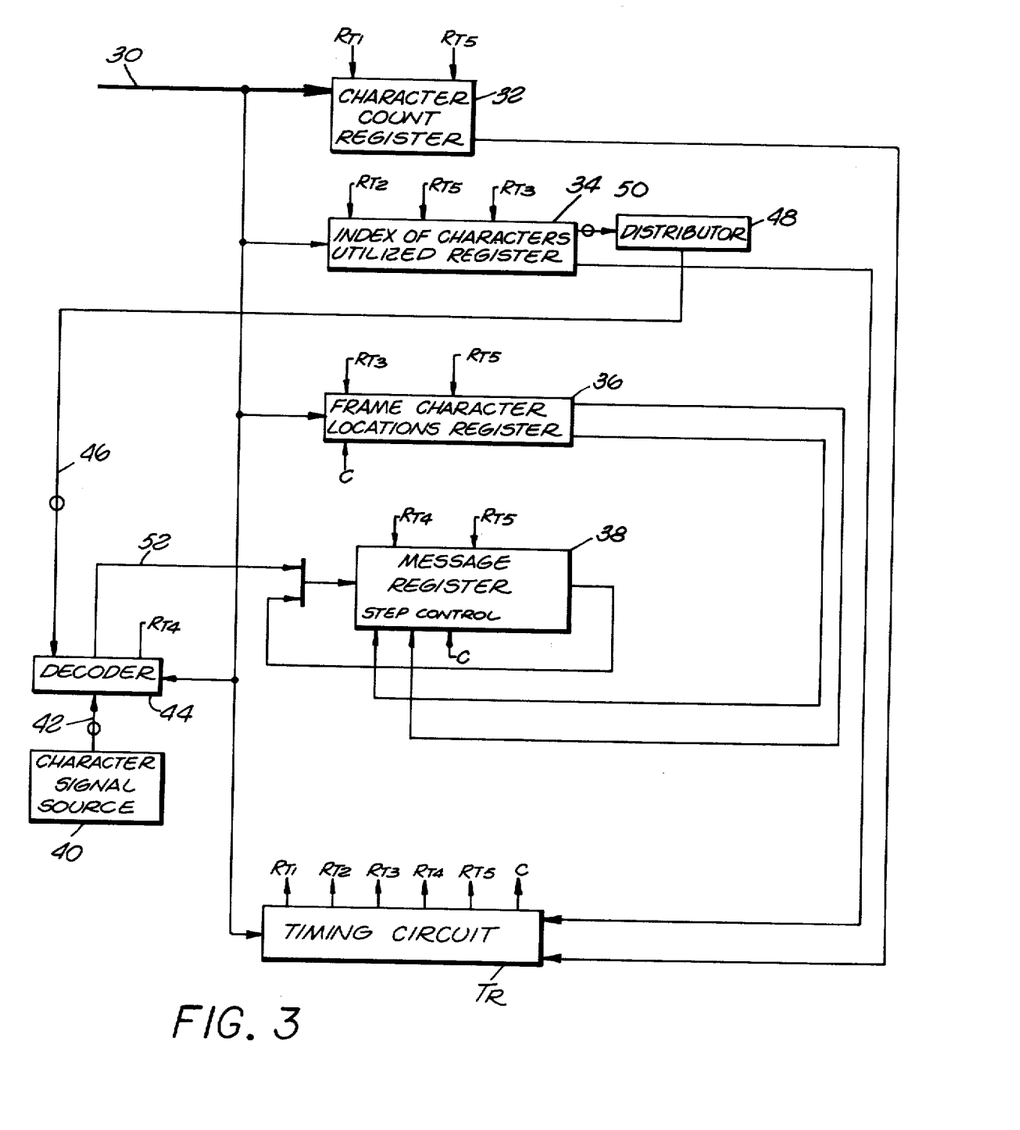
FIG. 3 is a block diagram showing an illustrative decoding embodiment of the present invention.

A signal path 30 (upper left) receives the bit stream and is connected to apply the binary signals (representative of the compacted format) to several different component circuits. Generally, the operation of such circuits is sequenced by a timing circuit TR which is completely independent of the timing unit T described with reference to FIG. 1. Essentially, the timing circuit TR may take a variety of different forms utilizing structures well known in the computer arts to provide clock signals as well as timing signals RT1, RT2, RT3, RT4, and RT5 as previously mentioned. Such signals are developed essentially from the received signal-represented compacted data. Specifically, the initial signal of a data block sets the timing circuit TR to provide a high state for the signal RT1 indicating the interval for receiving the count of characters which is registered in a character counter register 32. That is, pursuing the example, signals representative of the number "6" are placed in the register 32 during the interval RT1. Four binary bits are allotted for that data, at the termination of which the timing circuit TR provides the signal RT2 in a high state.

The next sequence, representing the index of characters utilized, is accepted in a characters-utilized register 34 which is qualified for operation by the signal RT2. Somewhat similarly, the binary series indicating the character locations utilized for the first frame are accepted in the frame character location register 36 during the interval of the timing signal RT3.

In the operation of the system of FIG. 3, the timing signals RT3 and RT4 are cycled for each frame of the compacted message. That is, at the conclusion of the signal RT3 in a high state, the interval of the signal RT4 is initiated during which the abbreviated binary representation for the characters of the first frame are received and appropriate signals are developed for entry in the message register 38 wherein the original message is reconstructed.

As the characters are represented in the compacted format by abbreviated characters, the conventional full-scale character representations of the original data sequence are provided from a source 40. The individual character signals are applied from the source 40 through a cable 42 to a decoder 44 which is controlled by signals received through a cable 46 from a distributor 48 which is in turn connected to the register 34 through a cable 50.

In operation, the four characters employed during each frame are selected from the register 34 by the distributor 48 for application to the decoder 44 during the occurrence of the specific frame involved. Thus, during each frame, the characters involved are provided from the register 34 to control the decoder 44. Consequently, when the abbreviated format for a character appears in the signal path 30 (during the interval of the signal RT4), its application to the decoder 44 results in an identification of the conventional signal for that character and the presentation of a binary representation of that signal to be provided in the line 52 for registration by the message register 38.

In view of the above introductory description of the system of FIG. 3, a comprehensive and full understanding of the structure and operation may now best be accomplished by pursuing the exemplary message treated extensively above. Accordingly, assume that the exemplary message is provided in a signal-represented binary format at the signal path 30. As previously indicated, the character count signal (number of different characters in the data block) is placed in the register 32. Thereafter, the index of characters utilized in the data block is placed in the register 34. Next, the sequence specifying the locations within the data block occupied by characters of the first frame is placed in the register 36. These operations occur during the intervals of timing signals RT1, RT2, and RT3.

In the continuing operation, the abbreviated codes for individual characters are received for developing specific characters in the message register 38. It is to be noted, that the register 38 is a cycling structure and is driven by clock pulses C so that as each frame is processed, the characters treated during that frame are set in the register 38. Again, it is to be emphasized that full characters are registered rather than the abbreviated characters received in the signal path 30.

Considering the exemplary message, the number "6" (FIG. 2) is set in the register 32 to indicate that six characters are utilized in the data block. Specifically, the utilized characters, 4, 2, 0, 3, 6, and 7, are placed in the register 34. The initial first-four characters are automatically selected for treatment in the first frame and signal representations for those characters are applied through the distributor 48 to the decoder 44 so that full binary representations of these characters can be supplied to the message register 38. The binary sequence indicative of the character locations is placed in the register 36 so that at the beginning of a high level for the time signal RT4, the first-frame characters may begin to be developed in the register 38.

Considering the compact format, it can be seen that the first abbreviated (two bits) binary code of characters indicates the character "2" (01). That binary representation at the decoder 44 results in a full binary code presentation to be manifest in the line 52, indicating the character "2" as the first character of the first frame. The binary location sequence for the characters of the first frame (FIG. 2) indicates that the first character of the first frame is the first character of the data block. That is, the presence of a "one" bit in the first position indicates that location is occupied by a character treated in the first frame. Accordingly, a binary representation of the numeral "2" is stepped into the stepping register 38 during three subclock pulses so as to register the first character of the message.

The next character of the message (00) is indicated by the abbreviated code to be a "4" and the binary location sequence indicates that character is the second character of the message. Accordingly, the full binary representation for the character (100) is stepped into the message register 38.

The following character of the message is indicated to be "3"; however, the presence of a "zero" in the binary location sequence indicates that the "3" is not to be registered as the next character (which is a "7"). Rather, the signal from the register 36 indicates that the third character location should not register a character at the present time, the character "7" being treated during a subsequent frame. Rather, the third character location is skipped (stepped) and full binary representation for the character "3" is registered in the fourth character location of the message. Thus, the system functions with characters being registered in appropriate locations within the message register 38 throughout the first frame. At the conclusion of the first frame, the timing signal RT4 ceases in a high state while the timing signal TR3 goes high to set the register 36 with the binary sequence of locations used for the second frame. Concurrently, the next characters are commanded by the cooperative interaction between the distributor 48 and the decoder 44. Thus, the operation is cyclic until all the characters have been treated. It is to be noted, that in the simplified example, the second frame would consist of only two characters and, accordingly, would be the terminating frame. Thereupon, the system would enter the operation indicated by timing signal RT5, which comprises a reset state pending receipt of the next block of data.

The above-described principles and teachings are applied in a second embodiment below whereby their application will result in a system for formatting an input message that accommodates full message content but utilizes fewer bits than the original message.

Figure 4:
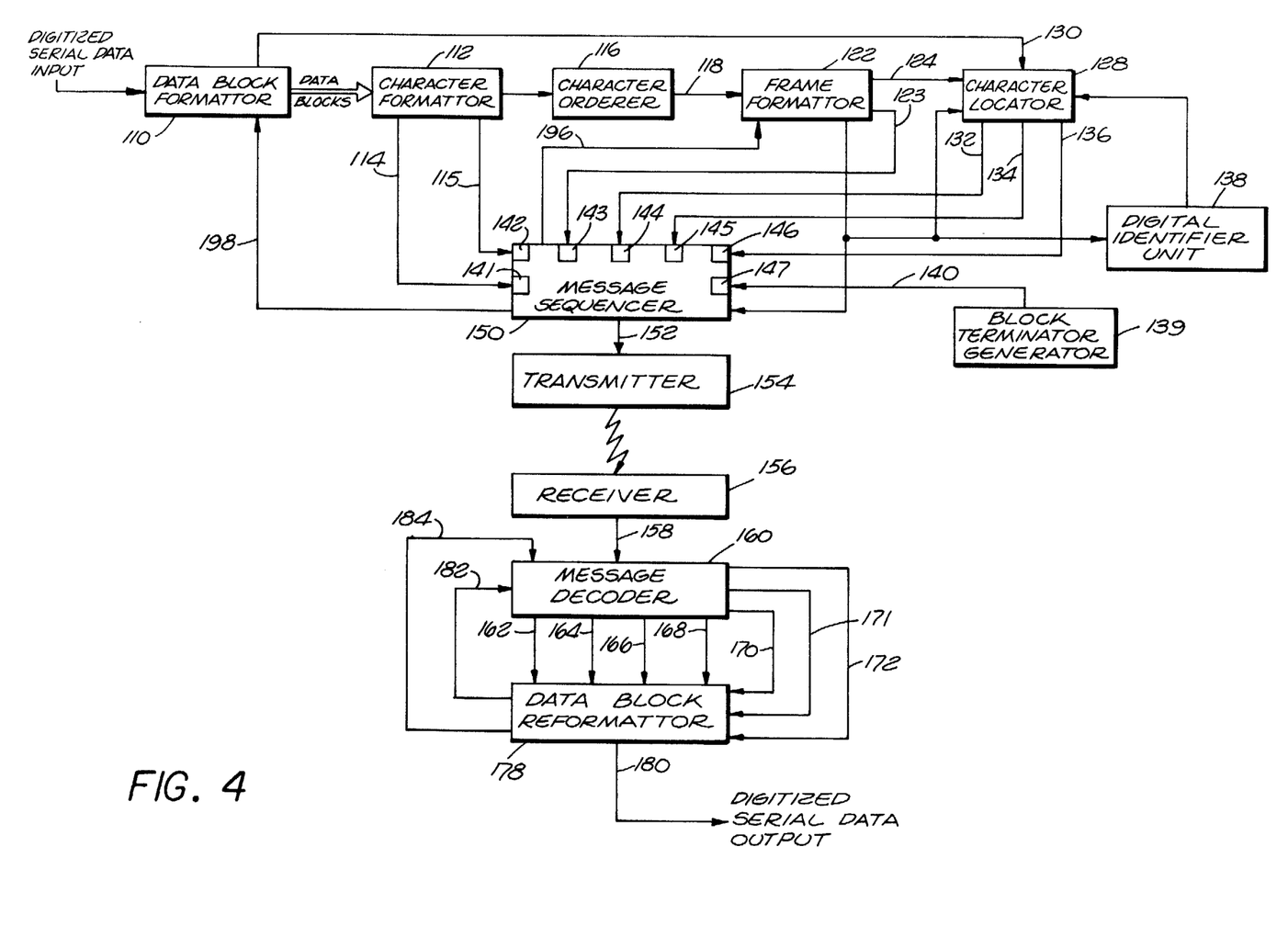
FIG. 4 is a block diagram showing various components of the apparatus according to a second embodiment of this invention.

The operative elements of the second embodiment and their inter-relationships are illustrated in FIG. 4. A data block formattor 110 divides a digitized serial data input into data blocks each of which contains 196 characters, each character having seven bits. A character formattor 112 compares the characters contained within each data block with a predetermined alpha-numeric listing or dictionary of possible characters which in the case of a seven-bit character consists of 128 possible characters. The character formattor 112 outputs (provides signals representative of identified data) a seven-bit word that indicates the number of characters present in the data block, the seven bits appearing on a "number of characters" output line 114. It also outputs a "characters utilized" bit stream on another output line 115, each bit corresponding to a character in the predetermined alpha-numeric listing. If a character is present in the data block, a "one" appears in the "characters utilized" bit stream and if a character is not present, a "zero" appears. However, as soon as the "ones" total the number of characters in the data block as indicated by the "number of characters" word, the "characters utilized" bit stream is terminated since all remaining bits would be "zero". This technique eliminates the necessity of sending "zeros" at the end of the "characters utilized" bit stream if none of the remaining characters appear in the data block. As indicated above, the predetermined alphanumeric code is ordered so that the least probable appearing characters will be at the end of the list.

A character orderer 116 counts the number of times each character appears in the data block and outputs an ordered character list on a single output line 118, some of the characters being ordered in accordance with their frequency of occurrence in the data block and some ordered according to a predetermined listing. In this embodiment, the last five to eight characters are ordered in accordance with their appearance in the predetermined alpha-numeric listing for reasons to be explained below, the other characters being ordered in accordance with their frequency of occurrence. As in the above example, when more than one character appears in the data block the same number of times, they are ordered in accordance with their appearance in the predetermined alpha-numeric listing. The data word orderer could also order the data words according to a predetermined order based upon an assumed frequency of occurrence for each character.

Again here, a frame consists of four characters. If the ordered character list contains more than eight characters, a frame formattor 122 divides the ordered character list into frames. The first frame contains the first four most-frequently appearing characters, the second frame contains the next four most-frequently appearing characters, and so on.

After dividing the ordered character list into frames, there may be up to three characters remaining depending upon the number of characters in the data block. These remaining characters plus the last full frame, or the last two full frames if there are no leftover characters, comprise a superframe. The superframe characters are ordered in accordance with the predetermined alpha-numeric listing and not in accordance with their frequency of occurrence for reasons which will be explained below. If the data block contains a total of less than nine characters then those characters constitute a superframe, and are ordered in accordance with the predetermined alpha-numeric listing and processed as a superframe as explained below. The frame formattor 122 sequentially outputs the characters contained in each frame and the superframe on two output lines 123 and 124, and outputs a superframe designation pulse on line 125 to indicate when the superframe characters are being outputted.

A character locator 128 (connected to the line 124) identifies the location of the characters within a frame with respect to character locations within the data block which have not been previously identified. It receives the complete digitized data block on an input line 130 from the data block formattor 110 and identifies which character locations within the data block contain characters treated in the first frame.

The character locator 128 outputs a serial bit stream designated as "Current Frame Character Locations" on an output line 132 which for the first frame has a bit corresponding to each character location in the data block. As described above, if a character location contains a first-frame character, then the corresponding bit is a "one"; otherwise it is a "zero". Thus, in the example shown (FIG. 5, dissected in a raster pattern) the "Current Frame Character Locations" corresponding to the four first-frame characters would be a serial bit train of 196 bits having "ones" corresponding to those word locations containing first-frame characters and "zeros" corresponding to those word locations not containing first-frame characters.

The "Current Frame Character Locations" corresponding to the second-frame characters consists of a second serial bit train having a number of bits equal to 196 (the total number of characters in the data block) minus the number of word locations identified with first-frame characters. Again, each bit corresponds to a previously undesignated word location with "ones" corresponding to those word locations having second-frame characters and "zeros" corresponding to those word locations not having second-frame characters. The process repeats itself as previously explained for each succeeding frame and terminates when the superframe appears.

The character locator 128 also outputs a serial bit train denoted as "Current Frame Character Designations" on a corresponding output line 134. This output consists of a series of two-bit digital identifiers each of which corresponds, according to a predetermined code, to each of the character locations identified in the "Current Frame Character Locations" output. These two-bit digital identifiers are abbreviated codes to identify which of the four characters in the current frame corresponds to each character location indicated by a "one" in the "Current Frame Character Location" output.

When the character locator 128 receives a superframe designation indication, it then outputs a "Superframe Character Designation" bit stream on an output line 136. This bit stream consists of three-bit digital identifiers which identify the superframe characters according to a second predetermined code. The three-bit digital identifiers are sequentially ordered so that they correspond to the ordering of the remaining unidentified characters within the data block.

A digital identifier unit 138 generates the two-digit and three-digit codes as previously explained. A block terminator generator 139 outputs a seven-bit word which signals the end of the current data block.

A message sequencer 150 samples its input lines, 114, 115, 123, 132, 134, 136, and 140 through corresponding storage registers 141, 142, 143, 144, 145, 146, and 147 according to a predetermined order as will be explained below. If only a superframe is being transmitted as previously discussed, the message sequencer 150 does not sample the current frame registers 143, 144, and 145.

A serialized digital output on an output line 152 from the message sequencer 150 is provided to a transmitter 154 which could be a datum or an electromagnetic radiator of many conventional types.

At a receiving portion of the apparatus, a receiver 156 outputs a digital bit train on an output line 158 which corresponds to the digital output from the message sequencer 150 to the transmitter 154. A message decoder 160 has separate outputs for "Number of Characters", "Characters Utilized", "Characters in Current Frame", "Current Frame Character Locations", "Current Frame Character Designations", "Superframe Character Designations", and "Block Terminator" on lines 162, 164, 166, 168, 170, 171, and 172, respectively.

A data block reformattor 178 reconstructs the original data block from the message decoder outputs on lines 162, 164, 166, 168, 170, 171, and 172 through a process to be explained below and provides a digitized serial data output on an output line 180 which is identical to the original digitized serial data input to the data block formattor 110.

Figure 5:
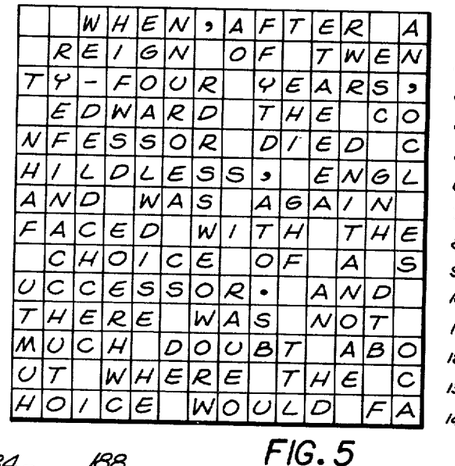
FIG. 5 is a graphic representation showing a 196-character data block containing a message to be transmitted by the apparatus of FIG. 4.
Figure 6:
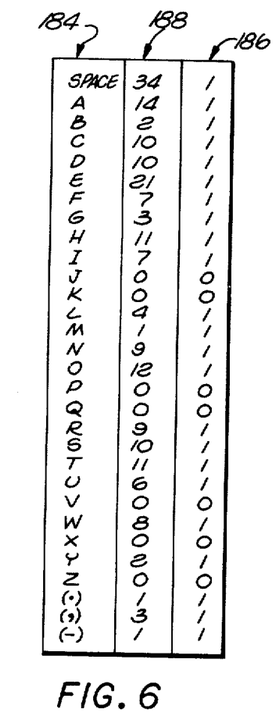
FIG. 6 is a listing of the characters contained in FIG. 5 and their frequency of occurrence.

To illustrate the above-described apparatus in operation, a portion of a sample message to be formatted, transmitted, received, and reformatted has been selected and is shown in FIG. 5. This portion contains 196 characters and constitutes a data block as previously defined. The message decoder 160 and data block reformattor 178 are conditioned for a 196-character data block, a seven-bit character, the predetermined digital identifiers for the frame and superframe characters as previously explained, and a predetermined alpha-numeric or character listing. The data block formattor 110 receives the digitized serial data input and divides it into data blocks, one of which is shown in FIG. 5, and provides this as an input to the character formattor 112, still in digitized serial input format. The character formattor 112 registers the predetermined alpha-numeric listing of 128 possible characters, the first thirty of which are shown in the first column 184 of FIG. 6. The character formattor 112 then provides a serialized digital output as shown in column 186 of FIG. 6 having a "one" if a character is present in the current data block and a "zero" if not. This serialized bit train 186 is sent via the "Character Utilized" line 115 to a corresponding buffer 142 in the message sequencer 150 for use to be explained below. In addition, the character formattor 12 outputs the "Number of Characters" on an output line 114 with a seven-digit binary word which is stored in a corresponding buffer 141 in the message sequencer 150. The character formattor 112 also counts the number of times each character appears in the current data block and supplies that information, as shown in column 188 of FIG. 6, to the character orderer 116.

Figure 7:
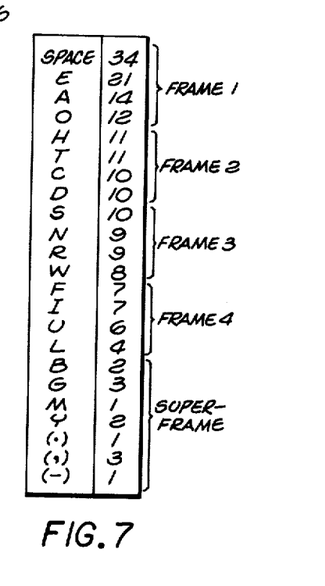
FIG. 7 is a chart showing the order of the characters of FIG. 6, in which the characters constituting frames or frame sets are ordered in accordance with their frequency of occurrence in the data block of FIG. 5 and the characters constituting a superframe are ordered in accordance with the character listing of FIG. 6.

The character orderer 116 provides as an output on its output line 118 an ordering of the characters in descending order according to their frequency of occurrence in the data word block as shown in FIG. 7. Ties are ordered in accordance to their appearance in the predetermined alpha-numeric listing shown in column 184 of FIG. 6. Ordering could be effected according to a predetermined ordering code, but for reasons to become evident, it is preferred to order in accordance with frequency of occurrence in the current data block.

The frame formattor 122 takes the ordered characters shown in FIG. 7 and divides them into frames, each consisting of four characters. The last full frame plus any remaining characters not contained within a full frame, or the last two full frames if there are not any unframed characters, is designated as a superframe and can have between 5 to 8 characters. In this example, the superframe shown in FIG. 7 contains seven characters consisting of BGMY., and—. It should be recognized that the frames could contain any number of characters, although to conserve transmission time they should contain a number which is an integral power of 2. Likewise the superframe could contain any number of characters. The frame and superframe content is stored in the frame formattor 122 until utilized as explained below.

Figure 8:
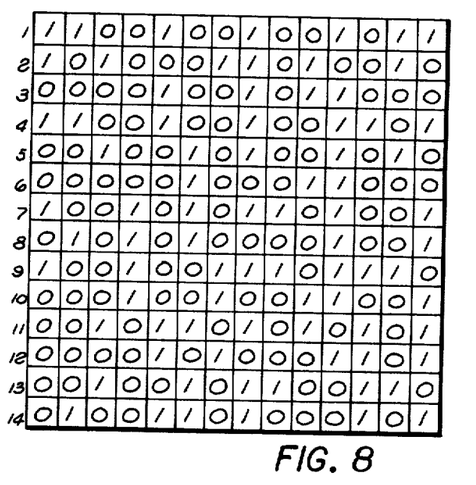
FIG. 8 is a graphic representation showing those first frame characters that appear relative to the other characters in the data block positional matrix of FIG. 5.

The frame formattor 122 transfers the first frame characters SPACE, E, A, and O as shown in FIG. 7 to the character locator 128 which also receives as an input the current data block bit stream from the data block formattor 110. From this information the character locator 128 constructs a positional matrix as shown in FIG. 8 having each position or location corresponding to a character location as shown in FIG. 5. Whenever a character contained within the first frame appears in the FIG. 5 data block, the character locator 128 inserts a "one" in the matrix; otherwise it inserts a "zero".

Figure 9:
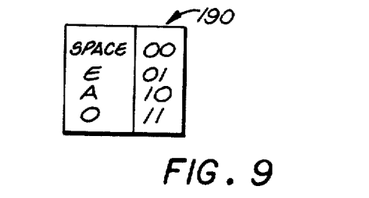
FIG. 9 is a chart showing first frame characters and their associated digital identifiers.
Figure 10:
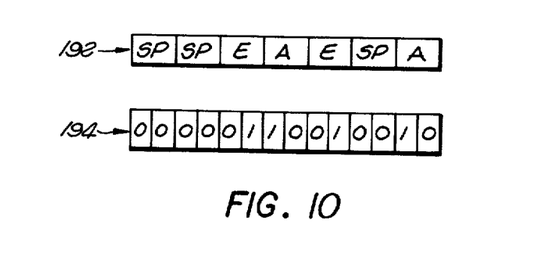
FIG. 10 is a graphic representation showing word designations for a first line of the representation of FIG. 8.

The matrix of FIG. 8 is outputted on the "Current Frame Character Locations" line 132 to a corresponding buffer 144 in the message sequencer 150. In addition, a digital identifier unit 138 provides to the character locater 128 an abbreviated two-bit digital identifier as shown in column 190 of FIG. 9, each identifier corresponding to one of the first-frame characters SPACE, E, A, or O. Using this information, the character locator 128 outputs a "Current Frame Character Designations" bit stream on an output line 134 which designates which of the current frame characters is contained in each of the character locations of FIG. 8 having a "one". Thus, for the first line of FIG. 8, the first-frame characters are shown in line 192 of FIG. 10 and the "Current Frame Character Designations" bit stream is shown in line 194. Similarly, digital identifiers shown in column 190 of FIG. 9 are applied to all the "one" positions indicated by FIG. 8 and transferred to a corresponding buffer 147 in the message sequencer 150.

Upon transfer of the first-frame data by the message sequencer 150 to the transmitter 154 by a process to be explained below, the message sequencer 150 generates a next frame pulse on a line 196 to the frame formattor 122 thereby causing the frame formattor 122 to transfer the characters H, T, C, and D contained in the second frame as shown in FIG. 7 to the character locator 128 and the appropriate buffer 143 in the message sequencer 150. However, the character locator 128 "shrinks" the original data block matrix shown in FIG. 8 to a matrix consisting only of those character locations having "zeros". Thus, the second-frame matrix will have only 115 possible character locations. This matrix is again converted into a serial bit stream having a "one" whenever a second-frame character, H, T, C, or D, appears and a "zero" otherwise, this bit stream then being transferred to the appropriate buffer 144 contained in the message sequencer 150. The character locator 128 also sequentially applies the same two-bit digital identifiers applied to the first-frame characters to the second-frame characters with the digital code as shown in FIG. 9, column 190, applied to H, T, C, and D, respectively. Then as in the first frame sequence, a serial bit stream is outputted on an output line 134 which identifies each of the "one" locations in the second-frame matrix with the appropriate second-frame character. The above-described process repeats itself until all the frames have been transferred.

Figure 11:
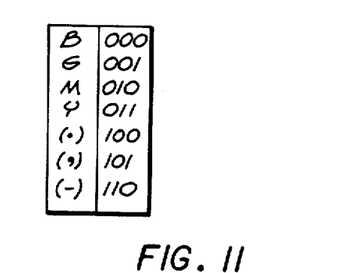
FIG. 11 is a chart showing superframe characters and associated digital identifiers.

At this point the frame formattor 122 sends a superframe designation pulse to both the digital identifier unit 138 and the message sequencer 150. The digital identifier unit 138 then outputs three-bit digital identifiers to the character locator 128, one of which is assigned to each of the superframe characters shown in FIG. 11. Since the superframe characters fill all of the remaining unidentified locations in the original data block matrix and are ordered according to the predetermined alpha-numeric listing shown in column 184 of FIG. 6, it is unnecessary to generate either a superframe character list or a superframe character location matrix. Therefore, the character locator 128 outputs only a superframe character designation bit stream on its corresponding output line 136 which is stored in an appropriate buffer 146 in the message sequencer 150.

The final input into the message sequencer 150 consists of a seven-bit block terminator word provided by a block terminator generator 139, the word being stored in its associated message sequencer buffer 147. A block terminated pulse is supplied by the message sequencer 150 to the data block formattor 110 via an interconnecting line 198 to indicate that the next data block can be transferred to the character formattor 112.

The message sequencer 150 sequentially samples its various buffers 141, 142, 143, 144, 145, 146, and 147 according to a predetermined sequence as explained below and outputs a serial bit train on its output line 152 to the transmitter 154. At the beginning of each data block, the message sequencer 150 sequentially samples and serially transfers the contents of buffers containing "Number of Characters" 141, "Characters Utilized" 142, "Characters in Current Frame" 143, "Current Frame Characters Locations" 144, and "Current Frame Character Designations" 145 to the transmitter 154. Upon completion of this transfer, it generates a next frame signal on a line 196 which causes an update of the current frame buffers 143, 144, and 145 with information corresponding to the second-frame characters as previously explained. The message sequencer 150 repeats the above-described second-frame cycle and outputs another next frame signal and so on until it receives a superframe designation from the frame formattor 122. At this time it reads the "Superframe Character Designation" buffer 146 and then the "Block Terminator" buffer 147 and then sends a block terminated signal to the data block formattor 110 to initiate transfer to the next data block.

Figure 12:
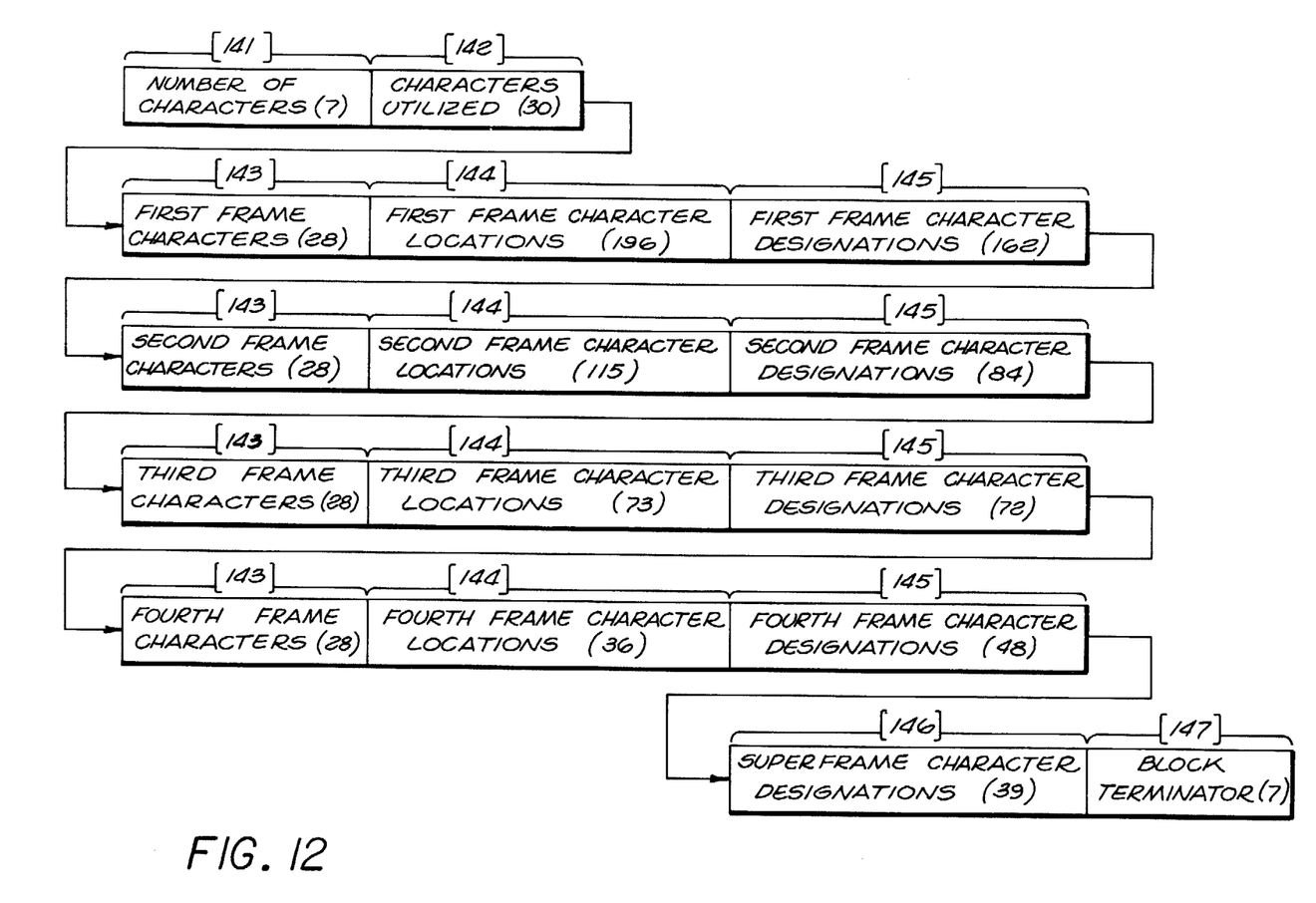
FIG. 12 is a graphic representation to illustrate the formatted data block prior to transmission which corresponds to the input digitized serial data.

As a result of the above-described sequence, the entire data block sequence and the number of bits contained within each portion thereof that appears on the message sequencer output line 152 is shown in FIG. 12. The buffer supplying each of the message segments is shown above each segment in brackets. It can be seen that the entire 196-character message has been transmitted with 981 bits whereas a seven-bit alpha-numeric code serially transmitted would require 1372 bits. Thus, the transmission method above described has significantly decreased the message length required to transmit the content of the FIG. 5 data block. This reduction in message length is primarily due to ordering like characters according to their frequency of occurrence in the data block and then transmitting their positions within the data block. One can appreciate that any analog signal, digitally coded, could be similarly processed with significant savings in transmission time, bandwidth, or both.

The message decoder 160 and the data block reformattor 178 operate conversely to the message sequencer 150 to construct the digitized serial data output. The message decoder 160 has output buffers (not shown) which contain "Number of Characters", "Characters Utilized", "Characters in Current Frame", "Current Frame Character Locations", "Current Frame Character Designations", "Superframe Character Designations", and "Block Terminator". The data block reformattor 178 reconstructs the original data block matrix by first determining from the "Number of Characters" and "Characters Utilized" signals those characters from the predetermined alpha-numeric code which are utilized in the current data block. Then from "Characters in Current Frame" it determines which characters are in the first frame, and where they go in the predetermined 196-character matrix from "Current Frame Character Locations" and "Current Frame Character Designations" information. The process is repeated for each frame and the message decoder 160 buffers (not shown) are updated each time the data block reformattor 178 sends a "next frame" pulse on an output line 182 to the message decoder 160. After the last frame is transferred, the data block reformattor 178 outputs a "Superframe Designation" pulse on an output line 184 to the message decoder 160 which causes it to output the "Superframe Character Designations" bit stream. Upon completion of the "Superframe Character Designations" transfer to the data block reformattor 178, the reformattor 178 outputs a digitized serial data output on its output line 180 identical to that of the digitized serial data input to the data block formattor 110.

What is claimed is:

1. A system of data reduction applicable for reducing a sequence of individual characters each of which may have been defined by a code having a predetermined number of bits, comprising:
    means for sequentially selecting different sets of said individual characters, controlled by the extent of presence of said characters in said sequence of characters;
    means for encoding each of said characters in said sets wherein set characters are distinguished from each other, within a set, by abbreviated codes;
    means for developing a first signal component for each of said sets to indicate those positions in said sequence of characters that are occupied by said set characters of a set;
    means for developing a second signal component for each of said sets to represent those occurrences of said set characters in said sequence, said second signal component representing said set characters by said abbreviated codes; and
    means for providing said signal components for said sets to represent said sequence of characters.

2. A system according to claim 1 wherein said means for sequentially selecting further includes means for resolving a priority with respect to characters present to an equal degree of occurrences.

3. A system according to claim 1 wherein said means for developing said first signal component comprises a binary coding means to provide a first binary signal to indicate the presence of any one of said characters in a set and a second binary signal to indicate the absence of any of said characters in a set.

4. A system according to claim 1 further including memory means to receive said first and second signal components.

5. A system according to claim 1 wherein said means for developing a second signal component includes means for scanning said sequence of characters to activate said means for encoding whereby characters of each set are encoded with similar abbreviated codes.

6. A system according to claim 1 wherein said means for encoding includes means for identifying said characters in said sequence, said system further including means for developing a third signal component for said sequence indicating the characters therein.

7. A system according to claim 6 wherein said means for developing a third signal component include means for terminating operation upon said means for developing treating each of said characters identified.

8. A system according to claim 1 further including means to receive said signal from said means for sequencing for transmission to a remote location.

9. A system according to claim 1 further including a register for cycling signals representative of characters to sequentially receive characters of said sets for accumulating said sequence of characters.

* * * * *